United States Patent
Suzuki et al.

(10) Patent No.: US 10,297,633 B2
(45) Date of Patent: May 21, 2019

(54) PHOTOELECTRIC CONVERSION DEVICE AND SCANNER

(71) Applicant: CANON KABUSHIKI KAISHA, Tokyo (JP)

(72) Inventors: Takanori Suzuki, Tokyo (JP); Takanori Watanabe, Yamato (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/996,967

(22) Filed: Jun. 4, 2018

(65) Prior Publication Data

US 2018/0366509 A1    Dec. 20, 2018

(30) Foreign Application Priority Data

Jun. 16, 2017   (JP) .................................. 2017-118839

(51) Int. Cl.
*H01L 27/146*   (2006.01)
*H01L 27/30*   (2006.01)

(52) U.S. Cl.
CPC .. *H01L 27/14643* (2013.01); *H01L 27/14678* (2013.01); *H01L 27/1462* (2013.01); *H01L 27/1463* (2013.01); *H01L 27/30* (2013.01)

(58) Field of Classification Search
CPC ............... H01L 27/146; H01L 27/1462; H01L 27/1463; H01L 27/14643; H01L 27/14678; H01L 27/30; H01L 27/32; H01L 27/301; H01L 27/3211; H01L 27/3212; H01L 27/3216; H01L 27/3218

See application file for complete search history.

(56) References Cited

U.S. PATENT DOCUMENTS

| | | |
|---|---|---|
| 5,119,156 A | 6/1992 | Kawahara et al. |
| 7,456,880 B2 | 11/2008 | Okita et al. |
| 7,911,521 B2 | 3/2011 | Kuroda et al. |
| 7,920,192 B2 | 4/2011 | Watanabe et al. |
| 7,935,995 B2 | 5/2011 | Watanabe et al. |
| 8,110,885 B2 | 2/2012 | Iida et al. |
| 8,411,187 B2 | 4/2013 | Watanabe et al. |
| 8,466,532 B2 | 6/2013 | Watanabe |
| 8,471,301 B2* | 6/2013 | Kudo .................. H01L 27/1462 257/230 |
| 8,570,418 B2 | 10/2013 | Watanabe |
| 8,779,544 B2 | 7/2014 | Yamashita et al. |
| 9,024,363 B2 | 5/2015 | Watanabe |
| 9,209,215 B2 | 12/2015 | Watanabe |
| 9,391,108 B2 | 7/2016 | Watanabe |
| 9,596,426 B2 | 3/2017 | Handa et al. |
| 9,825,077 B2 | 11/2017 | Watanabe et al. |
| 2011/0003426 A1 | 1/2011 | Watanabe et al. |

(Continued)

FOREIGN PATENT DOCUMENTS

| | | |
|---|---|---|
| JP | S64-072557 A | 3/1989 |
| JP | 2011-124522 A | 6/2011 |

*Primary Examiner* — Thanh T Nguyen
(74) *Attorney, Agent, or Firm* — Venable LLP

(57) ABSTRACT

A photoelectric conversion device, comprising a semiconductor substrate on which a plurality of pixels are arrayed, and an insulating member which is transparent and configured to cover the semiconductor substrate, wherein the insulating member includes at least three portions whose thickness are different from each other so as to increase types of wavelengths of light that are to be ripple reduction targets.

15 Claims, 9 Drawing Sheets

(56) References Cited

U.S. PATENT DOCUMENTS

| | | | |
|---|---|---|---|
| 2012/0181590 A1 | 7/2012 | Okita et al. | |
| 2012/0212637 A1 | 8/2012 | Tsuduki et al. | |
| 2012/0299066 A1* | 11/2012 | Kato | H01L 27/14612 |
| | | | 257/222 |
| 2016/0035767 A1* | 2/2016 | Matsuda | H01L 27/14621 |
| | | | 348/222.1 |
| 2016/0056187 A1* | 2/2016 | Lin | H01L 27/1462 |
| | | | 257/432 |
| 2016/0064429 A1 | 3/2016 | Iida et al. | |
| 2017/0345856 A1* | 11/2017 | Suzuki | H01L 27/14605 |

\* cited by examiner

PHOTOELECTRIC CONVERSION DEVICE AND SCANNER

BACKGROUND OF THE INVENTION

Field of the Invention

The present invention relates to a photoelectric conversion device and a scanner.

Description of the Related Art

A scanner for reading out an image on a recording medium includes a light source (for example, an LED) by which the recording medium which passes a readout face is irradiated with light and a photoelectric conversion device (for example, a line sensor) for detecting the light from the recording medium irradiated with the light. The photoelectric conversion device includes a semiconductor substrate on which photoelectric conversion elements (for example, photodiodes) and a readout circuit are arranged, an insulating member (for example, an interlayer insulating film) arranged on the semiconductor substrate, and the like. In the case of a color scanner, for example, a red LED, a green LED, and a blue LED are used as the aforementioned light sources, and the image on the recording medium is read out by causing the photoelectric conversion device to detect the light of each color from the recording medium by alternately driving the LEDs of the respective colors.

Among photoelectric conversion devices, there is a device in which a concave-convex shape is formed on a light receiving face (that is, the lower face of the insulating member) of a photoelectric conversion portion so as to reduce a ripple that may be generated due to the interference of reflected light (Japanese Patent Laid-Open Nos. 2011-124522 and 64-72557).

Since the state of the above-described interference of reflected light varies depending on the wavelength of the reflected light, the wavelength range of light that is to be a ripple reduction target will be broad in a structure required to detect light in various wavelength ranges such as the photoelectric conversion device used in the aforementioned color scanner. Hence, there is room for improvement in the structure of the photoelectric conversion device.

SUMMARY OF THE INVENTION

The present invention provides a technique advantageous in reducing a ripple in a photoelectric conversion device for detecting light in various wavelength ranges.

One of the aspects of the present invention provides a photoelectric conversion device, comprising a semiconductor substrate on which a plurality of pixels are arrayed, and an insulating member which is transparent and configured to cover the semiconductor substrate, wherein, in each of the plurality of pixels, the semiconductor substrate forms a plurality of concave portions which are arranged on a face in contact with the insulating member, each of the plurality of concave portions includes side faces and a bottom face, in each of the plurality of pixels, a lower face of the insulating member includes a plurality of first lower faces in contact with the bottom faces of respective concave portions and a plurality of second lower faces in contact with respective faces of the semiconductor substrate each positioned between two adjacent concave portions, in each of the plurality of pixels, an upper face of the insulating member includes a plurality of first upper faces and a plurality of second upper faces, in each of the plurality of first upper faces, at least one of the first lower faces and at least one of the second lower faces are arranged under the first upper face so as to be overlapped by the first upper face, in each of the plurality of second upper faces, at least one of the first lower faces and at least one of the second lower faces are arranged under the second upper face so as to be overlapped by the second upper face, and at least three of first through fourth distances are different from each other: (i) the first distance from the first lower face to the first upper face above the first lower face, (ii) the second distance from the first lower face to the second upper face above the first lower face, (iii) the third distance from the second lower face to the first upper face above the second lower face, and (iv) the fourth distance from the second lower face to the second upper face above the second lower face.

Further features of the present invention will become apparent from the following description of exemplary embodiments with reference to the attached drawings.

DESCRIPTION OF THE EMBODIMENTS

Figure 1A:
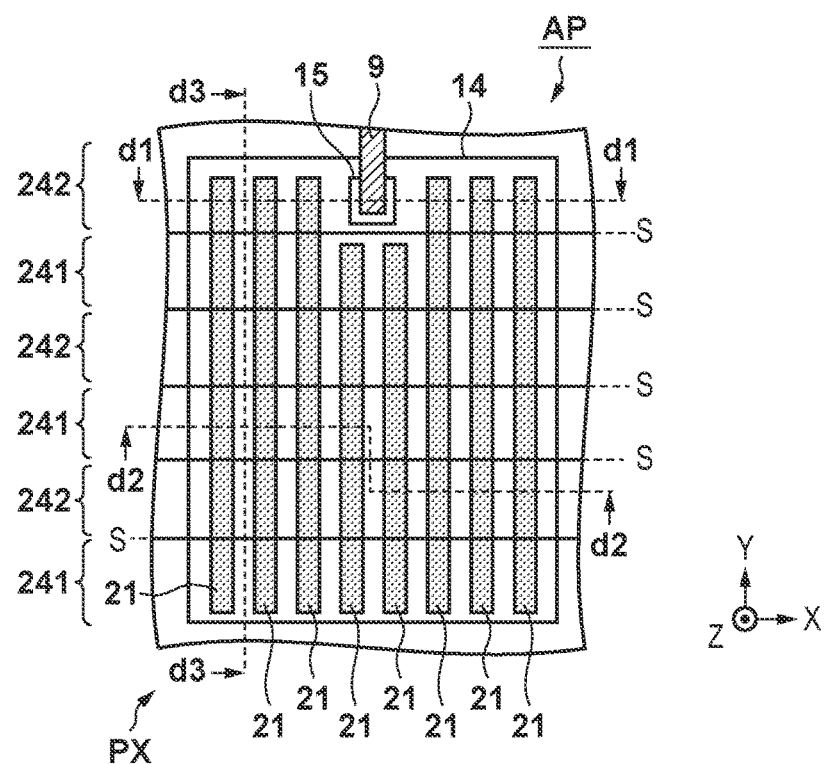
FIGS. 1A to 1D are views for explaining the structure of a photoelectric conversion device.

Embodiments of the present invention will be described below with reference to the accompanying drawings. Note that the drawings are schematic views showing the structure or arrangement according to the embodiments, and the dimensions of illustrated members do not necessarily reflect actual dimensions. Note also that the same reference numerals denote the same members or the same elements throughout the drawings, and an explanation of the repetitive contents will be omitted.

First Embodiment

Figure 1B:
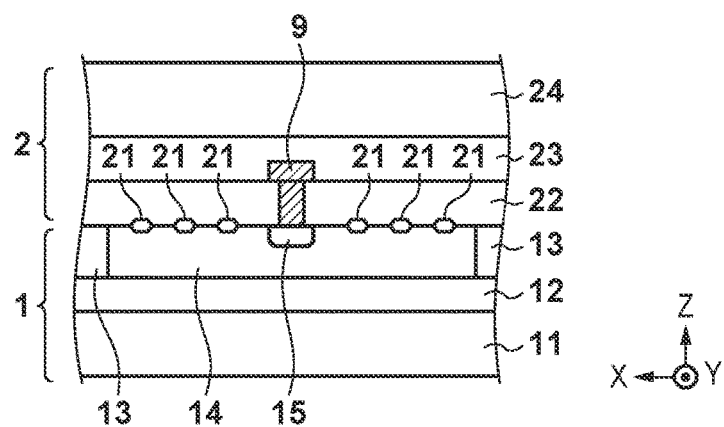
Figure 1C:
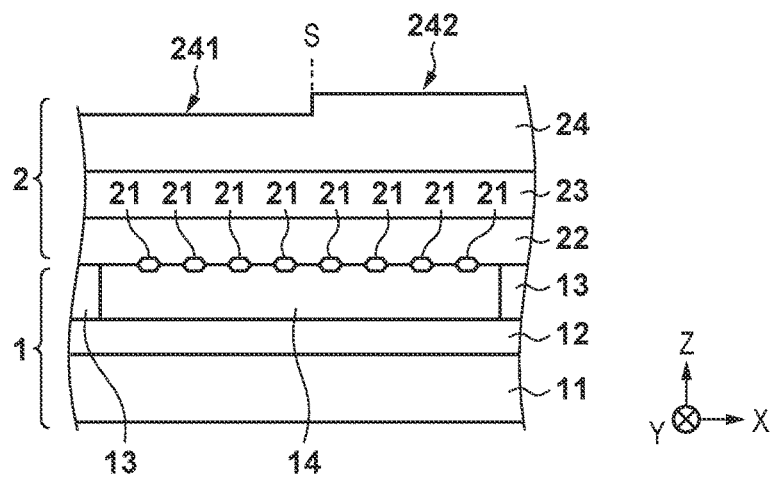
Figure 1D:
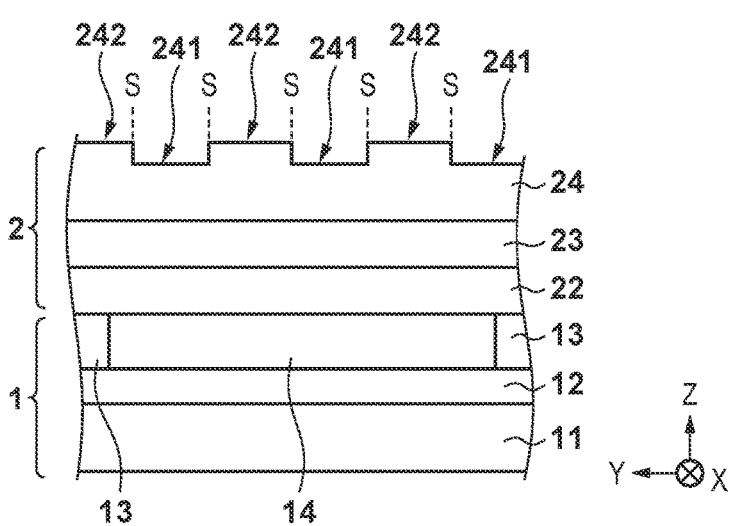

FIG. 1A shows a portion of the upper face layout of a photoelectric conversion device AP according to the first embodiment. FIG. 1B shows a sectional structure taken along a line d1-d1 of the photoelectric conversion device AP. FIG. 1C shows a sectional structure taken along a line d2-d2 of the photoelectric conversion device AP. FIG. 1D shows a sectional structure taken along a line d3-d3 of the photoelectric conversion device AP. Note that to facilitate the understanding of the structure, an X-axis, a Y-axis, and a Z-axis that are orthogonal to each other are shown in the drawings (assume that the same also applies to other drawings). An X direction and Y direction correspond to a horizontal direction, and a Z direction corresponds to a perpendicular direction (that is, the vertical direction with respect to the cross-section of the device AP). That is, in a case of placing the photoelectric conversion device AP on a horizontal plane, the Z direction corresponds to a height direction of the photoelectric conversion device AP, and also corresponds to a thickness direction of each member/element of the photoelectric conversion device AP.

The photoelectric conversion device AP includes a semiconductor substrate 1 on which a plurality of pixels PX are arrayed and an insulating member 2 which is transparent and covers the semiconductor substrate 1. Here, for the sake of descriptive convenience, the structure of the photoelectric conversion device AP will be described by focusing on a single pixel PX. That is, the pixel PX exemplified in FIG. 1A is actually arranged as a plurality of pixels in a line or an array (so as to form one or more columns) in a planar view. Assume that the dimension of one pixel (or the arrangement interval of the plurality of pixels PX) is, for example, about 10 μm to 30 μm for each of the X direction and the Y direction.

Note that in this specification, a planar view indicates a state seen in the Z direction (for example, a state in the viewpoint of FIG. 1A), that is, a state seen in a direction perpendicular to a reference face such as the bottom face of the semiconductor substrate 1. Note that, the bottom face of the semiconductor substrate 1 is mentioned as one example of the reference face here, but the reference face may be a face of any member/element of the photoelectric conversion device AP, for example, in a case of placing the device AP on the horizontal plane, the reference face is parallel to the horizontal plane.

A silicon substrate is used as the semiconductor substrate 1 according to this embodiment. However, a substrate made of another semiconductor such as gallium arsenide or the like may be used as another embodiment. As obvious from FIGS. 1B to 1D, the semiconductor substrate 1 includes a plurality of semiconductor regions 11 to 15, and these regions are provided so as to form a photoelectric conversion element (for example, a photodiode) in each pixel PX while partitioning the pixels PX.

For example, the semiconductor region 11 is a comparatively low-concentration n-type region (a region in which the net concentration of an n-type impurity is comparatively low). The semiconductor region 12 is a comparatively high-concentration n-type region and is a region with a higher concentration of an impurity than at least the region 11. The semiconductor region 13 is a comparatively high-concentration n-type region and is a region with a higher concentration of an impurity than at least the region 11. The semiconductor region 14 is a comparatively low-concentration n-type region and is a region with a lower concentration of an impurity than at least the regions 12 and 13. The semiconductor region 15 is a comparatively high-concentration p-type region (a region in which the net concentration of the p-type impurity is comparatively high, and in general the absolute value of the p-type concentration in the region 15 is larger than the absolute value of the n-type concentration in the region 14).

In this embodiment, the n-type region 14 is arranged deeper than the p-type region 15 so as to surround the p-type region 15. As a result, the n-type region 14 and the p-type region 15 form a photodiode by forming a pn junction. This photodiode is electrically isolated from the deep region 11 of the substrate 1 by the high-concentration n-type region 12, and is electrically isolated from other photodiodes of adjacent pixels by the high-concentration n-type region 13. The photoelectric conversion device AP further includes a wiring portion 9 for reading out charges generated in the photodiode, and the region 15 is connected to the wiring portion 9. As a result, a signal (pixel signal) corresponding to the charge amount is output to a readout circuit (not shown). In this embodiment, assume that holes are used as signal charges.

Note that p-type conductivity (first conductivity type)/n-type conductivity (second conductivity type) of the regions 11 to 15 may be changed as needed. For example, the region 11 may be a p-type region. In addition, although holes will be used as the signal charges in this embodiment, the region 14 and the region 15 may be set as the p-type region and the n-type region, respectively, in a case in which electrons are to be used as the signal charges.

The insulating member 2 is arranged on the light incident side of the semiconductor substrate 1, and in this embodiment, the insulating member is formed by stacking a plurality of insulating layers. The insulating member 2 includes a plurality of field oxide layers 21 arranged on the semiconductor substrate 1, a first insulating layer 22, a second insulating layer 23, and a third insulating layer 24.

Each oxide layer 21 is an insulating layer arranged in a line along the Y direction. The oxide layer 21 is formed by performing field oxidation on the semiconductor substrate 1. In this embodiment, each oxide layer is formed together with LOCOS (Local Oxidation of Silicon) for element isolation, that is, it is formed in the same process as LOCOS. Each oxide layer 21 is made of silicon oxide, and its refractive index is about 1.46. Note that in this specification, the refractive index of each layer and each member expresses the refractive index at a wavelength of 550 nm.

As obvious from FIG. 1A, in this embodiment, in a planar view, the p-type region 15 is arranged inside a rectangular outer edge and near the outer edge (near a side) of the n-type region 14, and each oxide layer 21 is arranged so as not to overlap the p-type region 15.

The insulating layer 22 is arranged to cover the plurality of oxide layers 21 on the semiconductor substrate 1. In this embodiment, the insulating layer 22 is made of BPSG (Boro-Phospho-Silicate Glass) formed by atmospheric CVD (Chemical Vapor Deposition) and sub-atmospheric CVD, and its refractive index is about 1.46.

The insulating layer 23 is arranged on the insulating layer 22. In this embodiment, the insulating layer 23 is made of silicon oxide formed by, for example, plasma CVD, and its refractive index is about 1.46.

The insulating layer 24 is arranged on the insulating layer 23. In this embodiment, the insulating layer 24 is made of silicon oxide and/or silicon oxynitride formed by, for example, plasma CVD, and its refractive index is about 1.6. Although a detailed description will be given later, a concave-convex shape is formed on the upper face of the insulating layer 24. Such a shape can be formed by etching using a photolithographic technique.

In this embodiment, the insulating member 2 is formed by stacking a plurality of insulating layers, and these layers are formed by a material whose refractive index is within a range of 1.4 or more. However, as another embodiment, the insulating member 2 may be formed from a single layer. Note that in this embodiment, assume that the upper face of the insulating member 2, that is, the upper face of the insulating layer 24 which is the uppermost layer of the insulating member 2 is exposed to air (about refractive index of 1).

Here, a concave-convex shape is formed on the lower face and the upper face of the insulating member 2. This will be described below with reference to FIG. 2.

Figure 2:
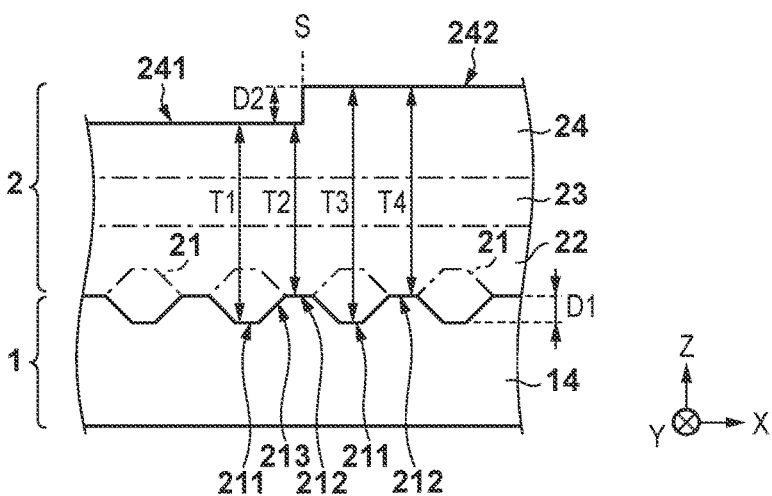
FIG. 2 is a view for explaining the structure of the photoelectric conversion device.

FIG. 2 shows an enlarged view of a region including a step (to be referred to a "step S") on the upper face of the insulating member 2 and the structure immediately below (that is, −Z direction) the step S shown in FIG. 1C. Here, a solid line indicates the profile of the insulating member 2 in the section of the photoelectric conversion device AP, and an alternate long and short dashed line indicates the boundary face of each of the layers 21 to 24 forming the insulating member 2.

The lower face of the insulating member 2 forms the boundary face (alternatively, a light receiving face of the pixel PX) between the semiconductor substrate 1 and the insulating member 2. The lower face of the insulating member 2 includes a flat (parallel to the X-Y plane) lower face. In this embodiment, this flat lower face includes a plurality of first lower faces (each concave face or a bottom face of each concave portion) 211 and a plurality of second lower faces (each convex face or each face between two adjacent concave portions) 212 that are parallel to each other and form the concave-convex shape. The lower faces 211 and the lower faces 212 have different heights. In this embodiment, as obvious from FIGS. 1A, 1B, and 1C, each lower face 211 and each lower face 212 are alternately arranged at a predetermined interval (first interval) in the X direction.

Although details will be described later, the lower face of the insulating member 2 further includes inclined faces 213 each connecting the lower face 211 and the lower face 212 adjacent to each other. Note that the inclination refers to a face which is inclined so as to cross the X-Y plane. Although each inclined face 213 is represented by a straight line in the drawing, it is moderately curved in practice.

In this embodiment, the upper face of the insulating member 2 forms an air-exposed face (alternatively, light incident face of the pixel PX) of the insulating member 2. The upper face of the insulating member 2 includes a flat (parallel to the X-Y plane) upper face. In this embodiment, this flat upper face includes, above each pixel, a plurality of first upper faces (concave faces) 241 and a plurality of second upper faces (convex faces) 242 that are parallel to each other and form a concave-convex shape. The upper faces 241 and the upper faces 242 have different heights. In this embodiment, as obvious from FIGS. 1A and 1D, each upper face 241 and each upper face 242 are alternately arranged at a comparatively large interval (a second interval larger than the aforementioned first interval) in the Y direction.

As shown in FIG. 2, a reference symbol D1 indicates a height difference (to be also known as a length in the Z direction, or thickness, hereinafter) between the lower faces 211 and 212, and a reference symbol D2 indicates a height difference, that is, the step S between the upper faces 241 and 242. A reference symbol T1 indicates a distance (to be also known as a length in the Z direction hereinafter) from each lower face 211 to the corresponding upper face 241 immediately above (that is, +Z direction). A reference symbol T2 (=T1−D1) is a distance from each lower face 212 to the corresponding upper face 241 immediately above. A reference numeral T3 (=T1+D2) indicates a distance from each lower face 211 to the corresponding upper face 242 above. A reference symbol T4 (=T3−D1) indicates a distance from each lower face 212 to the corresponding upper face 242 above. In this embodiment, assume that D1≠D2 and that the distances T1 to T4 are different from each other. Note that, the distance T1 corresponds to a thickness of a portion of the insulating member 2 above one lower face 211, and the distance T3 corresponds to a thickness of another portion of the insulating member 2 above another lower face 211. Also, the distance T2 corresponds to a thickness of a portion of the insulating member 2 above one lower face 212, and the distance T4 corresponds to a thickness of another portion of the insulating member 2 above another lower face 212.

Figure 9A:
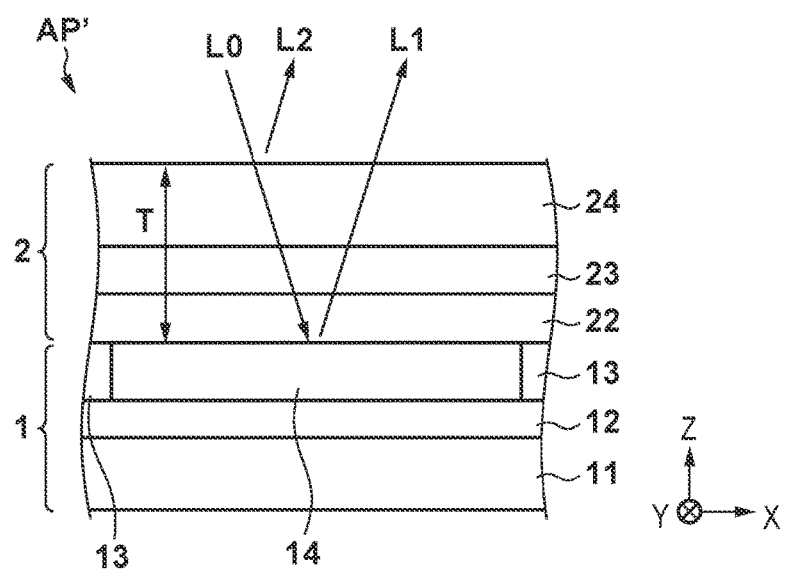
FIGS. 9A and 9B are views for explaining the structure of a photoelectric conversion device as a comparative example.

Here, to facilitate the understanding of the invention, a photoelectric conversion device AP' will be described as a first comparative example with reference to FIG. 9A. The device AP' according to the first comparative example differs from the device AP according to this embodiment in that the device AP' does not have the height differences D1 and D2. That is, in the device AP' according to the first comparative example, both the upper face and the lower face of the insulating member 2 are flat faces without any steps in the entire region of the pixel PX.

Here, light (incident light) L0 entering the pixel PX from the upper side is reflected on the upper and lower faces of the insulating member 2, and reflected light L1 and reflected light L2 may be generated. Focusing on light of a predetermined wavelength, under a condition in which a phase difference of about 180° is generated in accordance with the optical path difference between the reflected light L1 and the reflected light L2, the reflected light L1 and the reflected light L2 are reduced and suppressed. That is, in a case in which the above-described phase difference is about 180°, the ratio (to be defined as "light reflectance" in this specification) of the light amount of the reflected light L1 and reflected light L2 to the light amount of the incident light L0 will decrease. In other words, the ratio (to be defined as "light transmittance" in this specification) of the light amount of the incident light L0 that is detected by the pixel PX without being detected will increase. On the other hand, under a condition in which the above-described phase difference is not about 180°, the light reflectance will increase and the light transmittance will decrease.

Note that although the insulating member 2 is formed from the plurality of layers 21 to 24, since the light amount of each reflection that may occur in a boundary face between these layers is sufficiently small compared to those of the reflected light L1 and reflected light L2, it will not be considered in this specification.

Whether the above-described phase difference will be 180° depends on the wavelength of the light. For example, while the light transmittance is high for a predetermined wavelength because the above-described phase difference is 180°, the light transmittance may be low for another wavelength because the above-described phase-difference is not 180°. That is, the light reception efficiency of each pixel PX may vary depending on the wavelength of the light, and for example, increasing (or decreasing) the wavelength causes the light reception efficiency of the pixel PX to increase or decrease. This phenomenon is called a "ripple", and a detailed description thereof will be given later with reference to FIG. 8 (SPL#1 in FIG. 8).

Whether the above-described phase difference will be 180° also depends on a film thickness T (alternatively, an optical film thickness) of the insulating member 2. For example, while the light transmittance is high in a predetermined film thickness T, the light transmittance is low in another film thickness T'. Hence, if the film thickness T varies between pixels because of a macroscopic manufacturing variation due to, for example, manufacturing variation between the devices AP' or the pixels, the signal values (pixel values) of pixel signals may vary, even if the light amount of the incident light L0 is uniform, because the light transmittance varies between the pixels.

The photoelectric conversion device AP according to this embodiment is arranged in consideration of the aforementioned problems, and can detect light in various wavelength ranges and effectively reduce the above-described ripple.

Referring again to FIGS. 1A to 2, according to this embodiment, the insulating member 2 includes the lower faces 211 and 212 that have different heights. For the light of the predetermined wavelength, by setting a condition in which an about 180° phase difference is generated between the reflected light of each lower face 211 and the reflected light of each lower face 212, the high/low relationship of light transmittance (high/low of the light reflectance) of the wavelength can be reversed to a low/high relationship. Hence, by arranging, in the pixel PX, the lower faces 211 and 212 that have different heights, the intensities of the respective reflected light beams are canceled for the light of the predetermined wavelength, and thus the ripple can be reduced. The insulating member 2 also includes upper faces 241 and 242 whose heights are different from each other. By setting a condition in which a phase difference of about 180° is generated between the reflected light of each upper face 241 and the reflected light of each upper face 242, a ripple can be reduced in the same manner.

Here assume that n1: a refractive index of layers 21 to 23 (n1≈1.46 in this embodiment), n2: a refractive index of the layer 24 (n2≈1.6 in this embodiment), λ: a wavelength to be target of reducing reflected light, and $k_{ODD}$: an arbitrary odd number (1, 3, 5, . . . , etc). At this time, ideally the height differences D1 and D2 are set by $$D1=\lambda/(4\times n1)\times k_{ODD}$$

$$D2=\lambda/(4\times n2)\times k_{ODD}$$

When considering errors in the height differences D1 and D2 caused by a variation in manufacturing and the like, the height differences can be set by $$D1=\lambda/(4\times n1)\times k_{ODD}\pm\lambda/8$$

$$D2=\lambda/(4\times n2)\times k_{ODD}\pm\lambda/8$$

More preferably, the height differences are set by $$D1=\lambda/(4\times n1)\times k_{ODD}\pm\lambda/(8\times n1)$$

$$D2=\lambda/(4\times n2)\times k_{ODD}\pm\lambda/(8\times n1)$$

In this manner, by setting the height differences D1 and D2, the reflected light beams of an opposite phase can be superimposed on the light of the desired wavelength, and the above-described ripple can be reduced.

For example, concerning the height difference D1, it is possible to set D1=60 nm to 150 nm for the purpose of ripple reduction in one of the wavelengths in the visible light range (wavelengths of about 360 nm to 830 nm). Also, for example, concerning the height difference D2, for the purpose of ripple reduction of λ=about 630 nm (red light), it is possible to set D2=about 300 nm (when $k_{ODD}$=3).

Note that although the height difference D2 is set to be D2=about 300 nm (when $k_{ODD}$=3) in the above described example, it is sufficient for the value of the odd number $k_{ODD}$ to be determined in, for example, terms of manufacturing. For example, if the height difference D2 is set small, it becomes difficult to adjust the time of the processing (etching and the like) to form the height difference D2, and this may cause manufacturing variations. On the other hand, if the height difference D2 is set large, the time of the processing to form the height difference D2 is prolonged, and this may cause an increase in manufacturing cost. Thus, in this embodiment, it is set so that $k_{ODD}$=3 and D2=about 300 nm (250 nm (inclusive) to 350 nm (inclusive)).

In this embodiment, other than the lower faces 211 and 212, the insulating member 2 includes, in the lower face side, inclined faces 213 each connecting the lower faces to each other. As a result, there are regions in the lower face of the insulating member 2 which are equal to or less than the height difference D1. Hence, in the lower face of the insulating member 2, ripple reduction is possible even for a wavelength range shorter than the wavelength (630 nm) corresponding to the height difference D1. The lower faces 211, the lower faces 212, and the inclined faces 213 may be arranged so as to have a ratio in which their respective values are almost equal to each other in a planar view.

For example, $$W1\times 0.8\leq W2\leq W1\times 1.2,\text{ and}$$

$$W1\times 0.8\leq W3\leq W1\times 1.2,$$

may be established where W1 is the width (to be known as a width in the X direction hereinafter) of the lower face 211 in a planar view, W2 is the width of the lower face 212, and W3 is the width of the inclined face 213. Alternatively or in correspondence, W1/(W1+W2+W3) can be in the range of ⅓ to ⅔.

In general, since light of a long wavelength (for example, red light) has greater influence on vision (is more conspicuous) compared to light of a short wavelength (for example, blue light), it is preferable for a ripple to be reduced particularly in the long-wavelength range. Hence, in this embodiment, the height difference D2 on the side of the upper face of the insulating member 2 is set so as to reduce the ripple in the long-wavelength range (630 nm in this case).

From the above, in this embodiment, it is set so that D1=about 150 nm (within a range of an error of ±50 nm, more preferably within a range of ±10%) and D2=about 300 nm (within range of an error of ±50 nm). As a result, the ripple in the long-wavelength range is effectively reduced.

Figure 8:
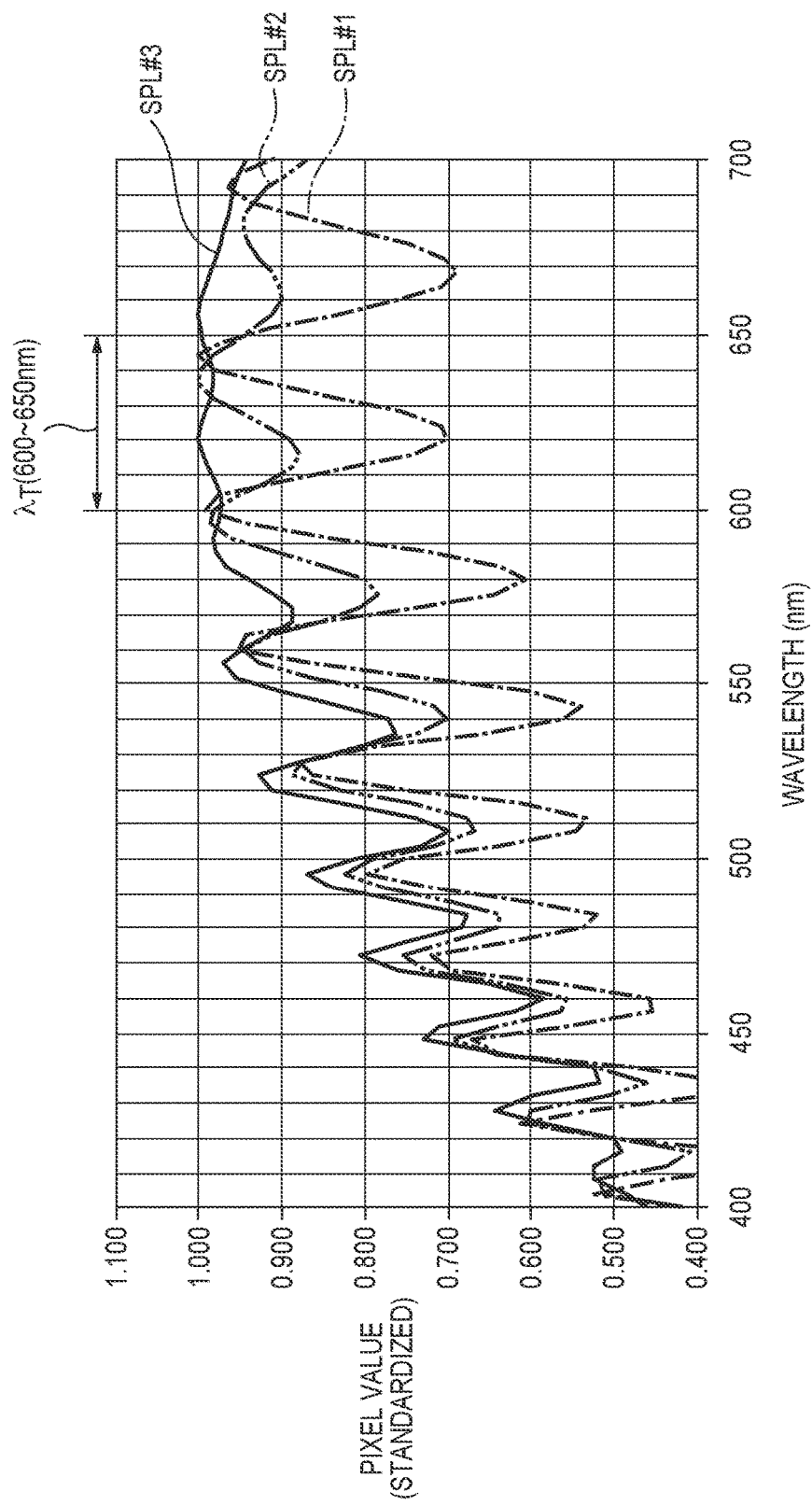
FIG. 8 is a graph for explaining a ripple reduction effect.

A ripple reduction effect obtained by a photoelectric conversion device 1 will be described with reference to FIG. 8. FIG. 8 shows the dependency (to be simply expressed as a "pixel characteristic" hereinafter) of the wavelength of the incident light in relation to a signal value (pixel value) of a pixel signal. In FIG. 8, the abscissa indicates the wavelength of incident light, and the ordinate indicates the pixel value that has been standardized by the pixel value of the wavelength of red light.

Figure 9B:
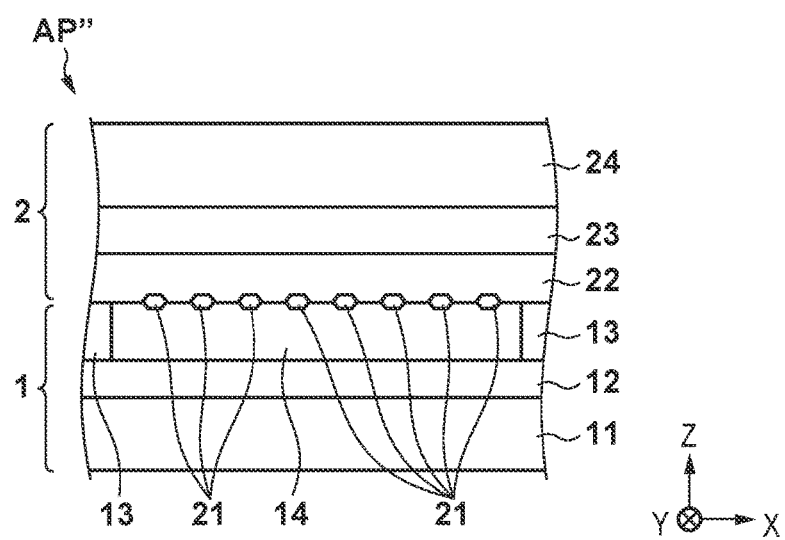

FIG. 8 shows the pixel characteristics of three types of samples. The samples indicated here are SPL#1 representing a structure in which neither the height difference D1 nor the height difference D2 is arranged (first comparative example), SPL#2 representing a structure in which only the height difference D1 is arranged (second comparative example), and SPL#3 representing a structure in which both the height difference D1 and the height difference D2 have been arranged (this embodiment). SPL#1 corresponds to the structure of the photoelectric conversion device AP' according to the aforementioned first comparative example shown in FIG. 9A. When described in relation to the structure (see FIGS. 1A to 2) of this embodiment, the first comparative example has, at least for each pixel PX, a flat face with no substantial steps (no substantial concave-convex shape) on the lower face and the upper face of the insulating member 2. SPL#2 corresponds to the structure of a device AP'" according to the second comparative example shown in FIG. 9B. When described in relation to the structure of this embodiment, in the second comparative example, for at least for each pixel PX, the lower faces 211 and 212 and the inclined faces 213 are arranged on the lower-face side of the insulating member 2, and the upper face of the insulating member 2 is a flat face with no substantial steps (no substantial concave-convex shape). Note that a step (for example, about 20 nm or less in this embodiment) of a degree in which the above-described reflected-light phase difference is not substantially generated is ignored concerning the flat face mentioned here.

In FIG. 8, an alternate long and short dashed line indicates the pixel characteristic of the first comparative example (SPL#1), an alternate long and two short dashed line indicates the pixel characteristic of the second comparative example (SPL#2), and a solid line indicates the pixel characteristic of this embodiment (SPL#3). In each pixel characteristic, if a given wavelength range shows a waveform whose amplitude fluctuates, it indicates the generation of a ripple in that wavelength range. Hence, in the first comparative example (SPL#1), it is apparent that the ripple is large over almost the entire wavelength range (at least between the wavelengths 400 nm to 700 nm) in FIG. 8.

On the other hand, in the second comparative example (SPL#2), it can be seen that the ripple has decreased between the wavelengths of 400 nm to 700 nm compared to that in the first comparative example (SPL#1). In the second comparative example (SPL#2), the insulating member 2 includes the flat lower faces 211 and 212 and the inclined faces 213 connecting the lower faces, that is, there is a region which is equal to the height difference D1 or less in the lower face of the insulating member 2. Accordingly, as described above, on the lower-face side of the insulating member 2, the ripple can be reduced in the wavelength (630 nm in this case) corresponding to the height difference D1 and in each wavelength range shorter than this wavelength. Hence, according to the second comparative example (SPL#2), the ripple is reduced to a certain degree for a comparatively wide wavelength range.

In contrast, according to this embodiment (SPL#3), it is apparent that the ripple has been further reduced compared to that of the second comparative example (SPL#2), and the ripple has been reduced particularly in the wavelength range (near a reference symbol $\lambda_T$ in FIG. 8) of the red light. As described above, in general, light of a long wavelength (for example, red light) has greater influence on vision. Hence, in this embodiment, other than the height difference D1 on the lower-face side of the insulating member 2, the height difference D2 that can reduce the ripple in the long-wavelength range has been arranged on the upper-face side of the insulating member 2, as has been described with reference to FIGS. 1A to 2. As a result, as it can be seen from FIG. 8, the ripple is reduced to about ⅕ of its original size in the wavelength range XT.

This can be explained as follows. First, paying attention to the second comparative example (SPL#2), it is possible to reduce the ripple generated in one type of wavelength for the first comparison example (SPL#1) by arranging the height difference D1 on the lower-face side of the insulating member 2 to the structure of the first comparison example (SPL#1). Here, by setting D1=about 150 nm, the ripple reduction target is set to the wavelength of 630 nm. In the second comparative example (SPL#2), the ripple reduction target wavelength range is increased by further arranging, as described above, the inclined faces 213 in the lower face of the insulating member 2. In this case, although it is possible to reduce the ripple in a comparatively wide wavelength range if the ratio of the inclined faces 213 is increased, this effect is lost, on the other hand, in the wavelength of 630 nm which is the original ripple reduction target. Hence, the desired ripple reduction effect may not be sufficiently obtained in the second comparative example (SPL#2).

In contrast, in this embodiment (SPL#3), it is possible to further increase the wavelengths of light that can be ripple reduction targets by arranging the height difference D2 on the upper-face side of the insulating member 2, and a ripple can be reduced more effectively than in the second comparative example (SPL#2). Here, by setting D2=about 300 nm as the ripple reduction target wavelength from arranging the height difference D2, the wavelength is set to 630 nm. As this is obvious from the above-described pixel characteristics (FIG. 8), this is expressed as a difference in ripple reduction effects between the second comparative example (SPL#2) and this embodiment (SPL#3) in the wavelength range XT (near the wavelength of 630 nm).

As described above, a long-wavelength light such as red light (wavelength of 630 nm) or the like has a great influence on vision. Hence, in this embodiment (SPL#3), a long wavelength range is selected as the ripple reduction target, that is, both the height differences D1 and D2 have been set so as to reduce the ripple in the long-wavelength range. However, the height differences D1 and D2 may be set so as to reduce ripples in two different wavelength ranges.

In this embodiment, by arranging the height difference D1 and the height difference D2 in the lower-face side and the upper-face side, respectively, of the insulating member 2, four types of distances T1 to T4 are set between the flat lower face and the flat upper face of the insulating member 2. According to such a structure, it is possible to increase the types of wavelengths of light to be ripple reduction targets, and the photoelectric conversion device AP can stably detect light in various wavelength ranges without receiving the influence of a ripple caused by manufacturing variations.

From this viewpoint, the distances T1 to T4 have been set to be different from each other in this embodiment. However, it suffices for at least three of the distances to be different from each other (for example, if D1=D2, T1=T4 is set, and three distances among the distances T1 to T4 will differ from each other). That is, it is sufficient for the insulating member 2 to be arranged so that there are three or more positions whose distances between the flat lower face and the flat upper face differ from each other. From another viewpoint, the insulating member 2 has a function of smoothing the light reflectance variation or the light transmittance variation in the single pixel PX, and it is sufficient for each pixel PX to have at least three portions, on its upper side, whose film thicknesses (thicknesses in the Z direction) differ from each other.

Referring to FIG. 1A again, the p-type region 15 is arranged near the upper side (the side on the side of a +Y direction) of the rectangular-shaped outer edge of the n-type region 14. Hence, of the charges generated by the photoelectric conversion, holes that are to be signal charges in this embodiment are mainly led in the +Y direction and collected in the region 15. Accordingly, each of the linear oxide layers 21 is arranged along the Y direction, that is, the lower faces 211 and 212 forming the concave-convex shape on the lower-face side of the insulating member 2 are alternately arranged in the X direction. As a result, charge collection efficiency can be improved. On the other hand, the upper faces 241 and 242 forming the concave-convex shape on the upper-face side of the insulating member 2 are alternately arranged in the Y direction (that is, a direction different from the above-described lower faces 211 and 212). Hence, according to this embodiment, ripple reduction is possible in incident light beams of various angles of incidence.

Here, in a planar view, it is sufficient for each of each step S between the upper faces 241 and 242 to be arranged so as not to overlap the region 15. The characteristic of the photodiode formed by the regions 14 and 15, that is, the electrical characteristic of the pixel PX is easily influenced by the pn-junction portion of the regions 14 and 15. Hence, it is preferable not to arrange each step S above the pn-junction portion. Accordingly, by arranging each step S so as not to overlap the region 15 in the planar view, for example, the electrical characteristic of the pixel can be stabilized.

As described above, according to this embodiment, it is possible to implement the photoelectric conversion device AP that can stably detect light in various wavelength ranges by increasing types of wavelengths of light that are to be ripple reduction targets by arranging the height difference D1 and the height difference D2 on the lower-face side and the upper-face side, respectively, of the insulating member 2.

This embodiment has exemplified a case in which the concave-convex shape, that is, the lower faces 211 and 212 (and in addition the inclined faces 213), on the lower-face side of the insulating member 2 are arranged by forming the oxide layers 21 together with LOCOS. However, the present invention is not limited to this. For example, the concave-convex shape on the lower-face side of the insulating member 2 may be arranged by STI (Shallow Trench Isolation). In this case, each side face of the STI may be inclined.

This embodiment has also exemplified a case in which the lower faces 211 and 212 of the insulating member 2 are alternately arranged in the X direction and the upper faces 241 and 242 are alternately arranged in the Y direction. However, these arrangement directions may be set to the planar direction that crosses both the X direction and the Y direction, for example, the diagonal direction of the pixel section.

This embodiment also exemplified, as the concave-convex shape on the upper-face side of the insulating member 2, a case in which each step S between the upper faces 241 and 242 is almost perpendicular. However, the present invention is not limited to this. For example, as another embodiment, each set of the upper faces 241 and 242 may be connected by an inclined face.

Second Embodiment

Figure 3A:
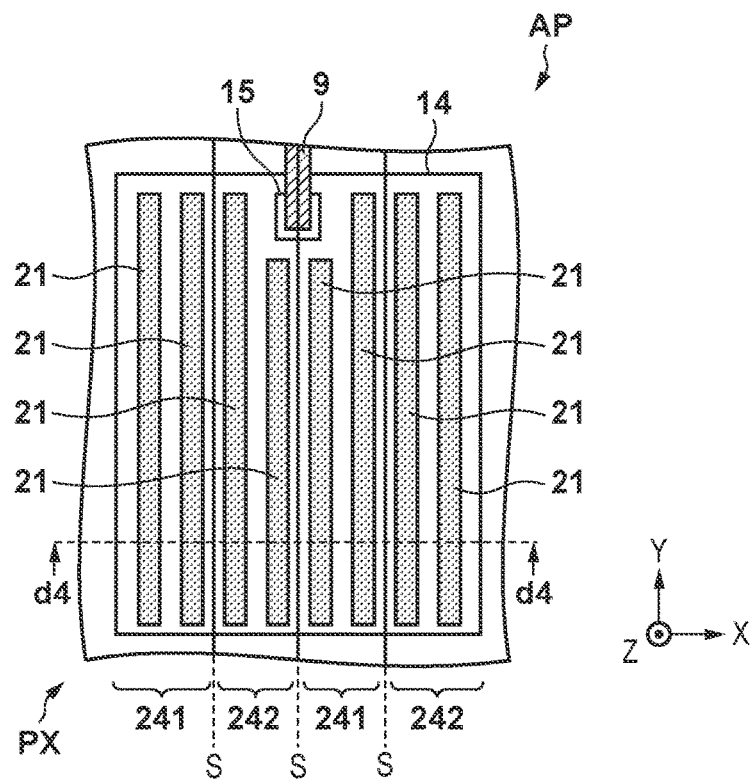
FIGS. 3A and 3B are views for explaining the structure of a photoelectric conversion device.
Figure 3B:
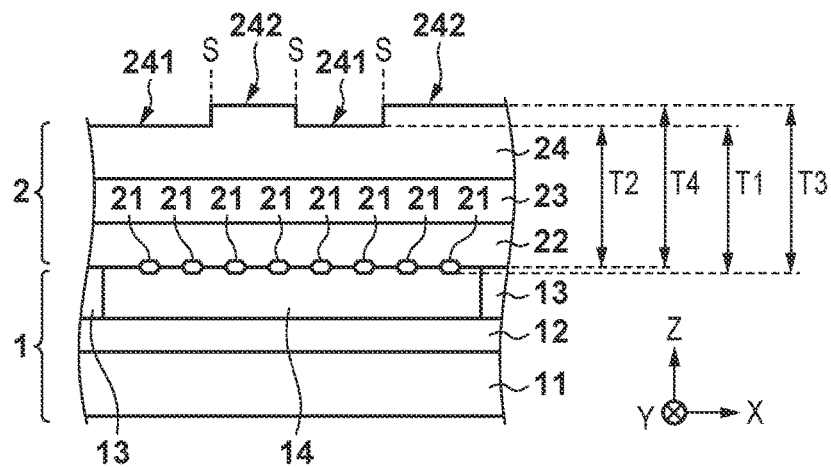

FIG. 3A shows the upper face layout of a photoelectric conversion device AP according to the second embodiment. FIG. 3B is a sectional view taken along a line d4-d4 of the photoelectric conversion device AP. This embodiment differs from the above-described first embodiment in that upper faces 241 and 242 forming the concave-convex shape on the upper-face side of an insulating member 2 are alternately arranged in the X direction. The same effects as those in the first embodiment are obtained by this embodiment.

As obvious from FIG. 3A, and as described in the first embodiment, each linear oxide layer 21 is arranged along the Y direction, that is, lower faces 211 and 212 (See FIG. 2. The same applies to other embodiments to be described hereinafter) forming the concave-convex shape on the lower-face side of the insulating member 2 are alternately arranged in the X direction. In this embodiment, the upper faces 241 and 242 forming the concave-convex shape on the upper-face side of the insulating member 2 are alternately arranged in the X direction in the same manner as the lower faces 211 and 212. For example, in a case in which it is expected that the angle of incidence of the incident light will be tilted in the +Y direction/−Y direction due to the application of the photoelectric conversion device AP or the like (for example, in a case in which the device AP is to be used as a line sensor), a ripple can be effectively reduced according to this embodiment.

Note that although the upper faces 241 and 242 are arranged, in a planar view, so that each step S overlaps the region 15, each step S may be arranged so as not to overlap the region 15. The same applies to other embodiments to be described hereinafter.

Third Embodiment

Figure 4A:
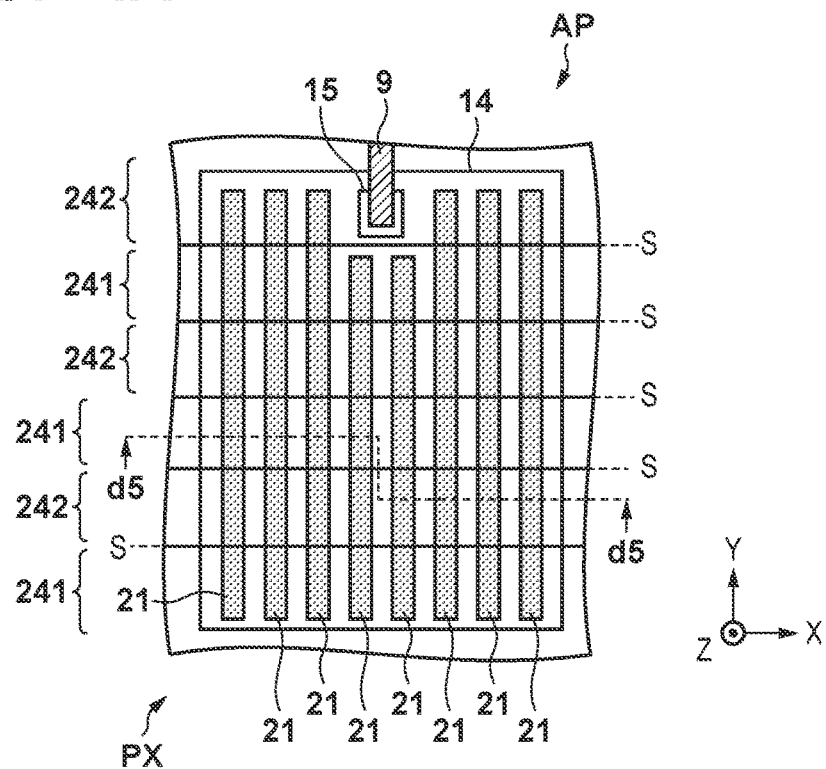
FIGS. 4A and 4B are views for explaining the structure of a photoelectric conversion device.
Figure 4B:
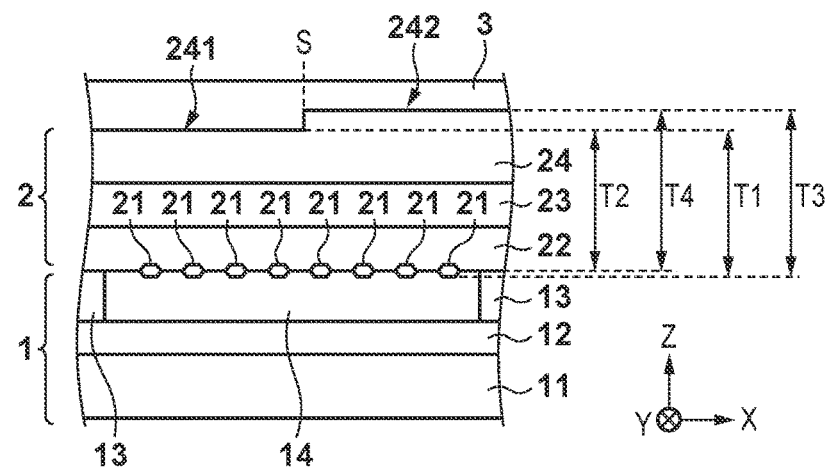

FIG. 4A is the upper face layout of a photoelectric conversion device AP according to the third embodiment. FIG. 4B is a sectional view taken along a line d5-d5 of the photoelectric conversion device AP. This embodiment differs from the first embodiment in that the photoelectric conversion device AP further includes a light-transmitting low refractive index member 3. The low refractive index member 3 is a second insulating member arranged on an insulating member 2 so as to cover first upper faces 241 and 242, and the upper face of the low refractive index member 3 has been planarized in this embodiment. The low refractive index member 3 is made of a material with a comparatively low refractive index, is made of, for example, porous/non-porous silicon oxycarbide, and has a refractive index of about 1.3 or less.

The refractive index of the low refractive index member 3 is smaller than the refractive index of any of layers 21 to 24 forming the insulating member 2. In this embodiment, the layers 21 to 24 of the insulating member 2 have been arranged so that the refractive index of a lower layer of two adjacent layers in the Z direction is equal to or lower than that of the refractive layer of an upper layer. In this case, the refractive index of the low refractive index member 3 is lower than the refractive index (about 1.46) of the oxide layer 21 which is the lowermost layer. In such an arrangement, since the incident light may be reflected mainly by the lower face of the insulating member 2 and a boundary face between the layer 24 of the insulating member 2 and the low refractive index member 3, ripple reduction needs to be considered in a manner similar to that in the first embodiment.

Thus, also in this embodiment, height differences D1 and D2 can be arranged on the lower-face side and the upper-face side, respectively, of the insulating member 2 to increase the types of wavelengths of light that are to be ripple reduction targets. As a result, the same effects as those in the first embodiment can be obtained. In addition, since the upper face of the low refractive index member 3 is planarized, for example, another member such as an optical system (lens) or the like can be further arranged on the low refractive index member, and thus is structurally advantageous. Alternatively, in the viewpoint of the manufacturing of the device AP, for example, it can prevent a situation in which a chemical solution may remain on steps S when cleaning processing or the like, and thus it is advantageous in terms of manufacturing.

Although this embodiment has exemplified a case in which a member that has a refractive index of about 1.3 is used as the low refractive index member 3, the refractive index of the low refractive index member 3 can be set based on the arrangement (more specifically, the materials used for the layers 21 to 24) of the insulating member 2. For example, if n21: refractive index of the oxide layer 21,
n22: refractive index of the insulating layer 22,
n23: refractive index of the insulating layer 23,
n24: refractive index of the insulating layer 24,
n0: refractive index of air, and
n3: refractive index of the low refractive index member 3 are set, the material of the low refractive index member 3 may be selected so as to satisfy all of $$|n3-n24|>|n21-n22|,$$

$$|n3-n24|>|n22-n23|,$$

$$|n3-n24|>|n23-n24|, \text{ and}$$

$$|n3-n24|\geq|n3-n0|.$$

Fourth Embodiment

Figure 5A:
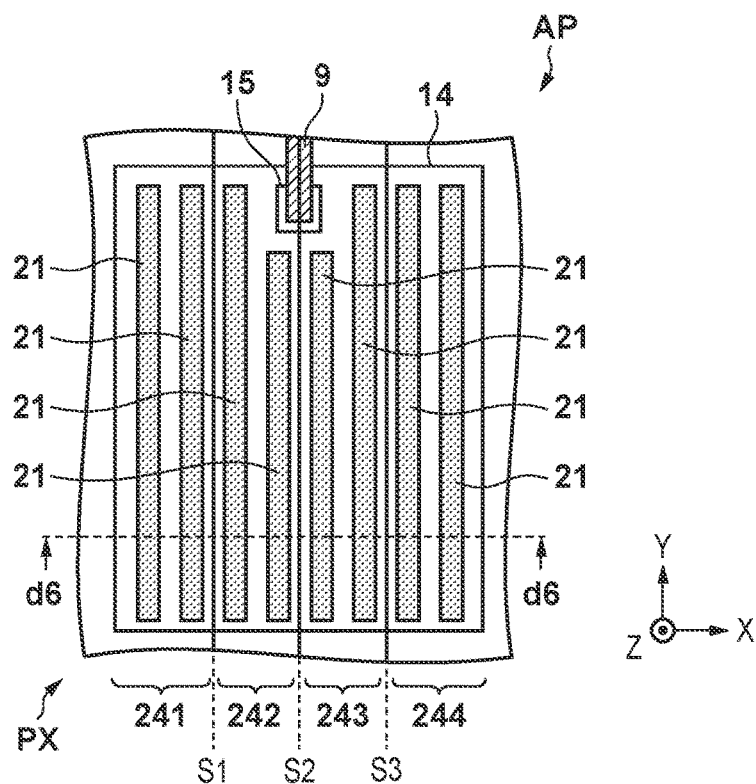
FIGS. 5A and 5B are views for explaining the structure of a photoelectric conversion device.
Figure 5B:
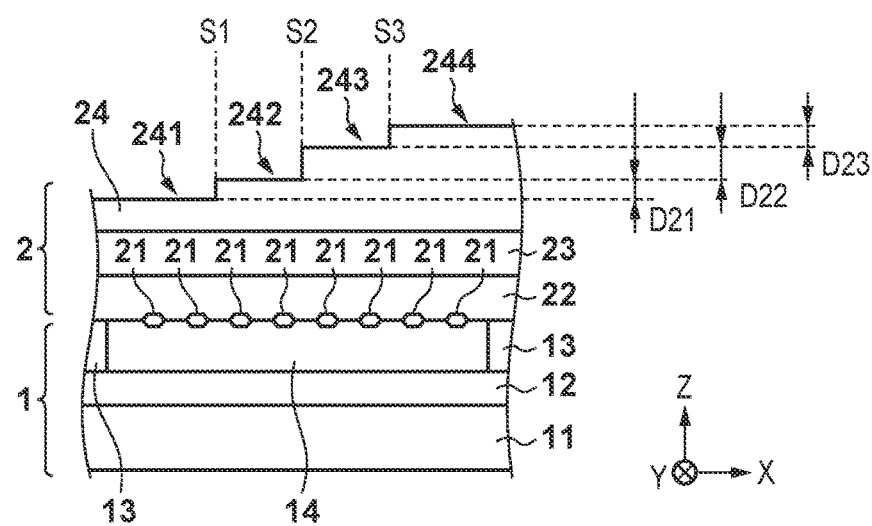

FIG. 5A is the upper face layout of the photoelectric conversion device AP according to the fourth embodiment. FIG. 5B is a sectional view taken along a line d6-d6 of the photoelectric conversion device AP. This embodiment differs from the first embodiment in that the upper face of an insulating member 2 is formed stepwise and not in a concave-convex shape. Such a structure can also form the insulating member 2 so that there will be three or more positions whose distances between a flat lower face and a flat upper face differ from each other, and the same effects as those in the first embodiment can be obtained.

In this embodiment, the flat upper face of the insulating member 2 includes four upper faces 241 to 244 aligned in the X direction, and the lowermost face among these faces is the upper face 241. The face 242 is positioned higher than the face 241, and a reference symbol D21 indicates the height difference of a step S1 between the upper faces 241 and 242. The face 243 is positioned higher than the face 242, and a reference symbol D22 indicates the height difference of a step S2 between the upper faces 242 and 243. The face 244 is the uppermost face among the upper faces 241 to 244, and a reference symbol D23 indicates the height difference of a step S3 between the upper faces 243 and 244.

Some/all of the above-described height differences 21 to 23 may be the same with or different from each other. However, it is preferable for at least some of the above-described height differences D21 to D23 to differ from each other. For example, a case in which D21=D23 and D22≠D21 (D22≠D23) are set is particularly preferable, and the wavelength of light that is to be the ripple reduction target by the height differences D21 and D23 differ from the wavelength of light that is to be the ripple reduction target by the height difference D22. That is, $$\lambda 1=4\times n2\times D21/k_{ODD}$$

$$\lambda 2=4\times n2\times D23/k_{ODD}(=\lambda 1)$$

$$\lambda 3=4\times n2\times (D21+D22)/k_{ODD}(\neq \lambda 1)$$

$$\lambda 4=4\times n2\times (D22+D23)/k_{ODD}(=\lambda 3)$$

where λ1, λ2, λ3, and λ4 are wavelengths of light that are ripple reduction targets by the height differences D21, D22, and D23.

Referring to FIGS. 5A and 5B, a case in which the areas of the upper faces 241 to 244 in a planar view are equal to each other will be considered. For example, the reflected light of the upper face 241 corresponds to the reflected light of the upper face 242, and the ripple of the wavelength λ1 is effectively reduced by the height difference D21. Also, for example, the reflected light of the upper face 243 corresponds to the reflected light of the upper face 244, and the ripple of the wavelength λ1 is effectively reduced by the height difference D23 (=D21). That is, the relationship between the reflected light of a region which has a given area in a pixel region and the reflected light of another region which has the same area will be reversed, and the ripple of the wavelength λ1 can be effectively reduced. The reflected light of the upper face 241 corresponds to the reflected light of the upper face 243, the reflected light of the upper face 242 corresponds to the reflected light of the upper face 244, and the ripple of the wavelength λ3 can be effectively reduced by a height difference (D21+D22=D22+D23). That is, in the case of the wavelength λ3, in the same manner as the wavelength λ1, the relationship between the reflected light of a region which has a given area in a pixel region and the reflected light of another region which has the same area will be reversed, and the ripple of the wavelength λ3 can be effectively reduced. Hence, ripple reduction can be effectively obtained in each of two types of wavelengths, that is, the wavelengths λ1 and λ3, without mutually influencing the ripple reduction effects.

As described above, this embodiment also can further increase the types of wavelengths of light that are to be ripple reduction targets, and the photoelectric conversion device AP can stably detect light in various wavelength ranges without the influence of a ripple caused by manufacturing variations.

Note that this embodiment exemplified a case in which the upper faces 241 to 244 are arranged so as to form the steps S1 to S3 stepwise in the X direction. However, as another embodiment, these steps may be arranged in the Y direction or in both the X direction and the Y direction. In addition, the number of steps S1 and the like on the upper face of the insulating member 2 is not limited to that in the example, and many steps may be arranged.

Fifth Embodiment

Figure 6A:
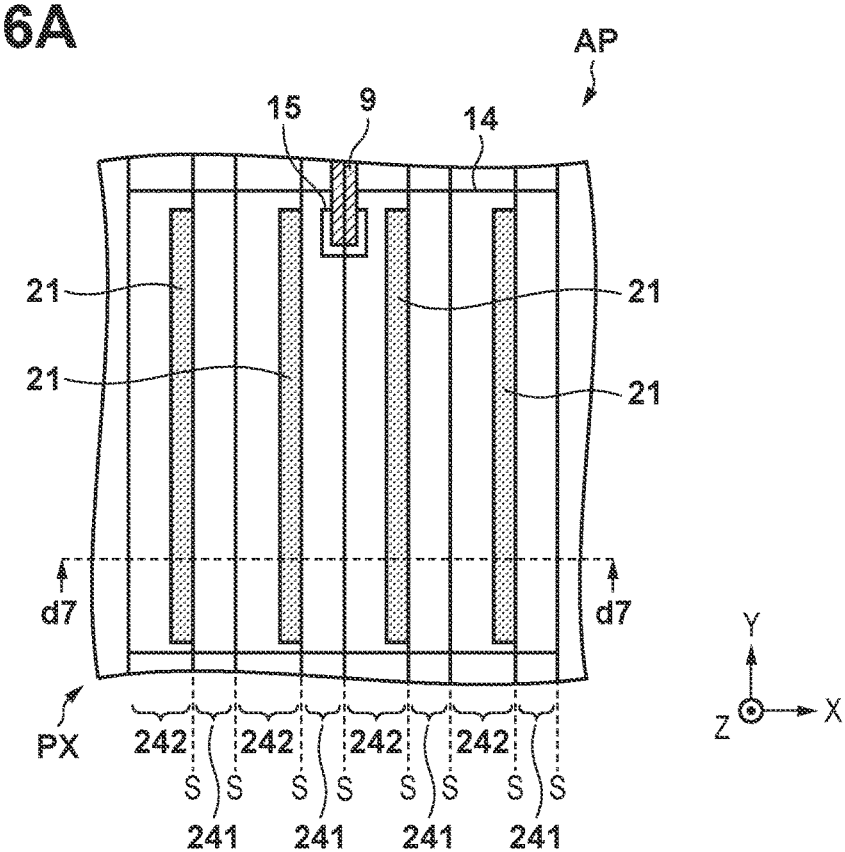
FIGS. 6A and 6B are views for explaining the structure of a photoelectric conversion device.
Figure 6B:
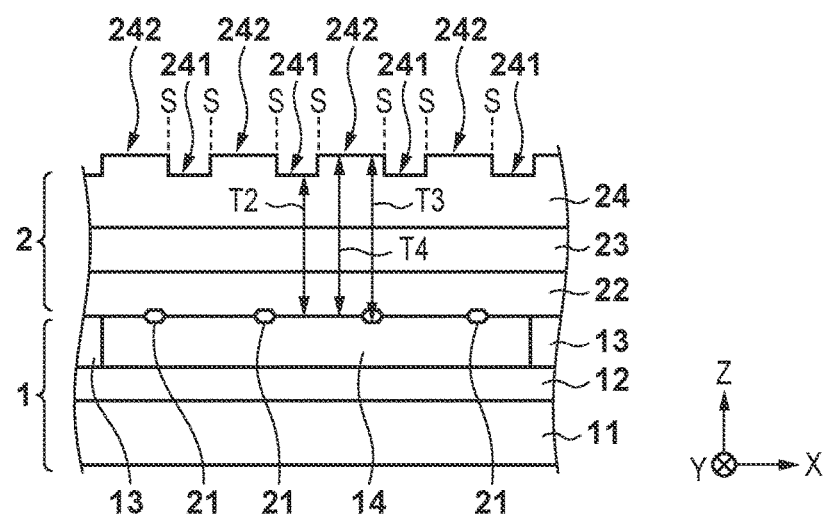

FIG. 6A is the upper face layout of a photoelectric conversion device AP according to the fifth embodiment. FIG. 6B is a sectional view taken along a line d7-d7 of the photoelectric conversion device AP. This embodiment mainly differs from the first embodiment in that the number of linear oxide layers 21 has been decreased from that in the above-described first embodiment. As a result, it becomes easier to collect holes that are to be signal charges in this embodiment to a p-type region 15, and thus charge collection efficiency can be improved.

Since the number of the oxide layers 21 has been reduced in this embodiment, while each upper face 242 overlaps both lower faces 211 and 212, each upper face 241 does not overlap any of the lower faces 211 and 212. That is, there are three types of distances T2 to T4 as the distances between the flat lower face and the flat upper face of the insulating member 2. However, as described above (see the first embodiment), it is sufficient for the insulating member 2 to be arranged so that there are three or more positions whose distances between the flat lower face and the flat upper face differ from each other. The types of wavelengths of light that are to be ripple reduction targets can also be increased in this embodiment, and the same effects as that in the first embodiment can be obtained.

Note that this embodiment has exemplified a case in which each of the upper faces 242 overlaps both of the lower faces 211 and 212. As another embodiment, however, each of the upper faces 241 may overlap both of the lower faces 211 and 212.

Sixth Embodiment

Figure 7A:
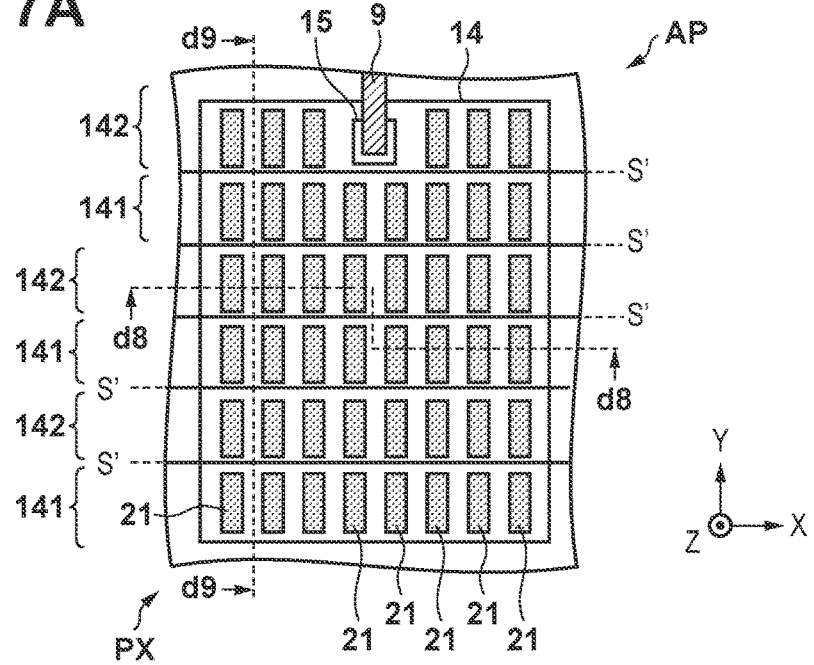
FIGS. 7A to 7C are views for explaining the structure of a photoelectric conversion device.
Figure 7B:
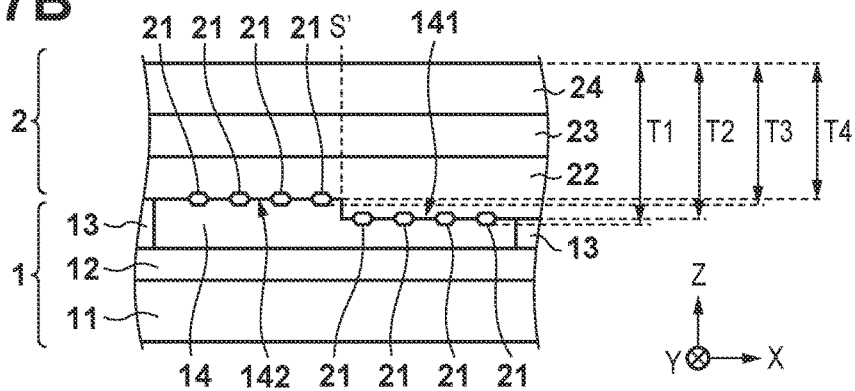
Figure 7C:
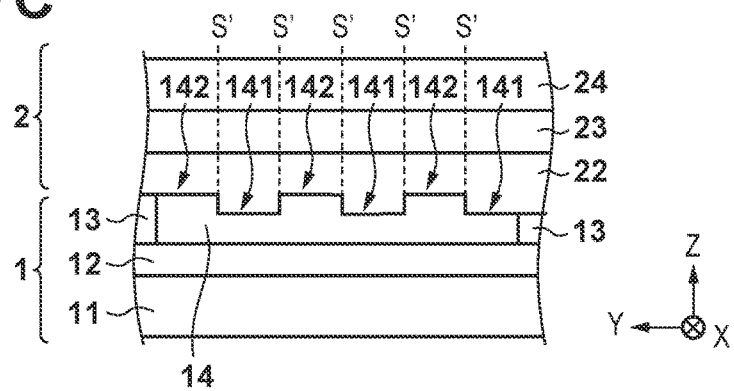

FIG. 7A is the upper face layout of a photoelectric conversion device AP according to the sixth embodiment. FIGS. 7B and 7C are sectional views taken along a line d8-d8 and a line d9-d9, respectively, of the photoelectric conversion device AP. This embodiment differs from the above-described first embodiment in that the entire upper face of an insulating member 2 is planarized, and two types of concave-convex shapes have been arranged on the lower face.

More specifically, in this embodiment, as obvious from FIGS. 7A and 7C, a semiconductor substrate 1 includes a plurality of upper faces (concave faces) 141 and a plurality of upper faces (convex faces) 142 forming a convex-concave shape. The upper faces 141 and 142 have different heights from each other and are alternately arranged in the Y direction. As obvious from FIG. 7A, a plurality of oxide layers 21 are arranged at a predetermined interval in the X direction on each of the faces 141 and 142.

Note that each oxide layer 21 linearly extends in the Y direction. However, since a step S' is present between each face 141 and face 142, the length of the oxide layer in the Y direction is shorter than that in the first embodiment because it is formed between two adjacent steps S' in the Y direction. In this embodiment, the height difference of each step S' is the same as a height difference D2 described above, but may be changed in accordance with the refractive indices of the insulating layers 21 and 22.

This structure can be obtained by forming the concave faces 141 and the convex faces 142 by etching the upper face of the semiconductor substrate 1 by a photolithography technique, and subsequently forming the oxide layers 21 on each of the faces 141 and 142 by field oxidation. Note that although the concave-convex shape formed by the faces 141 and 142 may be arranged over the entire region of a plurality of pixels PX, it is sufficient for the concave-convex shape to be arranged on at least in an n-type region 14 of each pixel PX.

In other words, the above-described structure can be described as follows from the viewpoint of the insulating member 2. That is, the concave-convex shape is formed on the lower face of the insulating member 2 so that the plurality of concave faces 141 and the plurality of convex faces 142 will be aligned in the Y direction at comparatively large intervals. Subsequently, on each of the faces 141 and 142, a concave-convex shape is formed by a plurality of concave faces 211 and a plurality of convex faces 212 aligned in the X direction at comparatively small intervals.

According to such a structure, as shown in FIG. 7B, four types of distances T1 to T4 are set as the distances between the flat lower face and the flat upper face of the insulating member 2. Hence, this embodiment also allows the insulating member 2 to be arranged so that there are three or more positions whose distances between the flat lower face and the flat upper face differ from each other. The types of the wavelengths of light that are to be ripple reduction targets can also be increased by this structure. As a result, the same effects as those in the first embodiment can be obtained.

(Others)

The photoelectric conversion device AP according to each embodiment is applicable to a scanner (image readout apparatus). Other than an apparatus whose main function is image readout, the concept of a scanner includes an apparatus that auxiliarily includes the function of a multifunction printer or the like. For example, a scanner includes the photoelectric conversion device AP, a processor that processes a signal from the photoelectric conversion device AP, a light source such as an LED array, and the like. Light from a readout target object irradiated by the light source enters the photoelectric conversion device AP via an optical system, for example, a rod lens or the like, and the photoelectric conversion device AP outputs a signal corresponding to this incident light to the processor. The processor processes the signal output from each photoelectric conversion device AP and generates image data. The image data is stored in a storage medium (for example, a hard disk, a flash EEPROM, or the like) in the scanner or stored in a server that can communicate with the scanner. The scanner may include a plurality of photoelectric conversion devices AP, and the plurality of photoelectric conversion devices AP may form a line sensor by being arrayed in a predetermined direction.

Several preferred embodiments have been described above. However, the present invention is not limited to these examples and may partially be modified without departing from the scope of the invention. For example, a part of the contents of an embodiment can be combined with the contents of another embodiment, and together with/in place of this, a known element may be added or removed as needed. Individual terms described in this specification are merely used for the purpose of explaining the present invention, and the present invention is not limited to the strict meanings of the terms and can also incorporate their equivalents.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-118839, filed on Jun. 16, 2017, which is hereby incorporated by reference herein in its entirety.

What is claimed is:

1. A photoelectric conversion device comprising:
   a semiconductor substrate on which a plurality of pixels are arrayed; and
   an insulating member which is transparent and configured to cover the semiconductor substrate,
   wherein, in each of the plurality of pixels, the semiconductor substrate forms a plurality of concave portions which are arranged on a face in contact with the insulating member,
   each of the plurality of concave portions includes side faces and a bottom face,
   in each of the plurality of pixels, a lower face of the insulating member includes a plurality of first lower faces in contact with the bottom faces of respective concave portions and a plurality of second lower faces in contact with respective faces of the semiconductor substrate each positioned between two adjacent concave portions, in each of the plurality of pixels, an upper face of the insulating member includes a plurality of first upper faces and a plurality of second upper faces, in each of the plurality of first upper faces, at least one of the first lower faces and at least one of the second lower faces are arranged under the first upper face so as to be overlapped by the first upper face, in each of the plurality of second upper faces, at least one of the first lower faces and at least one of the second lower faces are arranged under the second upper face so as to be overlapped by the second upper face, and at least three of first through fourth distances are different from each other:

the first distance from the first lower face to the first upper face above the first lower face, the second distance from the first lower face to the second upper face above the first lower face, the third distance from the second lower face to the first upper face above the second lower face, and the fourth distance from the second lower face to the second upper face above the second lower face.

2. The device according to claim 1, wherein, in a planar view, each of the first upper faces overlaps both the first lower face and the second lower face, and/or each of the second upper faces overlaps both the first lower face and the second lower face.

3. The device according to claim 1, wherein, in a planar view, the first lower faces and the second lower faces are alternately arranged at a first interval, and the first upper faces and the second upper faces are alternately arranged at a second interval larger than the first interval.

4. The device according to claim 3, wherein, in the planar view, the first lower faces and the second lower faces are alternately arranged in a first direction, and the first upper faces and the second upper faces are alternately arranged in a second direction that crosses the first direction.

5. The device according to claim 3, wherein, in the planar view, the first lower faces and the second lower faces are alternately arranged in a first direction, and the first upper faces and the second upper faces are alternately arranged in the first direction.

6. The device according to claim 1, wherein the semiconductor substrate is a silicon substrate, the insulating member is formed by stacking a plurality of insulating layers, and the plurality of insulating layers are each made of a material whose refractive index is not less than 1.4.

7. The device according to claim 1, wherein the insulating member is formed by stacking the plurality of insulating layers, and $$D2 = \lambda/(4 \times n2) \times k_{ODD} \pm \lambda/8$$

is satisfied where D2 is each step between the first upper face and the second upper face, n2 is a refractive index of an uppermost layer of the plurality of insulating layers, $\lambda$ is a wavelength of 630 nm, and $k_{ODD}$ is an arbitrary odd number.

8. The device according to claim 1, wherein $$D2 = \lambda/(4 \times n2) \times k_{ODD} \pm \lambda/8$$

is satisfied where D2 is each step between the first upper face and the second upper face, n2 is a refractive index of the insulating member, X is a wavelength of 630 nm, and $k_{ODD}$ is an arbitrary odd number.

9. The device according to claim 1, wherein the upper face of the insulating member is exposed to air.

10. The device according to claim 1, wherein the insulating member is a first insulating member, the photoelectric conversion device further comprises a second insulating member arranged on the first insulating member so as to cover the plurality of first upper faces and the plurality of second upper faces, and a refractive index of the second insulating member is smaller than a refractive index of the first insulating member.

11. The device according to claim 1, wherein the side faces of each concave portion are inclined faces, and $$W1 \times 0.8 \leq W2 \leq W1 \times 1.2, \text{ and}$$

$$W1 \times 0.8 \leq W3 \leq W1 \times 1.2,$$

are satisfied where W1 is a width of the first lower face in a planar view, W2 is a width of the second lower face, and W3 is a width of the inclined face.

12. The device according to claim 1, wherein the semiconductor substrate includes, in each pixel, a first region of a first conductivity type and a second region of a second conductivity type arranged deeper than the first region so as to surround the first region, the first region is connected to a wiring portion configured to output a signal based on charges generated by photoelectric conversion, and in a planar view, the first upper faces and the second upper faces are arranged so that the steps of the first upper faces and the second upper faces will not overlap the first region.

13. A scanner comprising:

a photoelectric conversion device defined in claim 1, and a processor configured to process a signal from the photoelectric conversion device.

14. The scanner according to claim 13, wherein the photoelectric conversion device is one of a plurality of photoelectric conversion devices arranged in a predetermined direction, and the processor generates image data by processing the signal from each of the plurality of photoelectric conversion devices.

15. The device according to claim 1, wherein, in each of the plurality of pixels, a first one of the plurality of first upper faces, a first one of the plurality of second upper faces, a second one of the plurality of first upper faces and a second one of the plurality of second upper faces are arranged in successive order.

* * * * *